(12) United States Patent
Kim et al.

(10) Patent No.: US 9,331,291 B2
(45) Date of Patent: May 3, 2016

(54) NON-VOLATILE MEMORY DEVICE AND METHOD OF MANUFACTURING THE SAME

(71) Applicant: KYUNGPOOK NATIONAL UNIVERSITY INDUSTRY-ACADEMIC COOPERATION FOUNDATION, Daegu (KR)

(72) Inventors: Youngkyoo Kim, Daegu (KR); Sungho Nam, Daegu (KR); Hwajeong Kim, Daegu (KR); Jooyeok Seo, Gyeongsanganm-do (KR); Soohyeong Park, Gyeongsangbuk-do (KR)

(73) Assignee: KYUNGPOOK NATIONAL UNIVERSITY INDUSTRY-ACADEMIC COOPERATION FOUNDATION, Daegu (KR)

( * ) Notice: Subject to any disclaimer, the term of this patent is extended or adjusted under 35 U.S.C. 154(b) by 0 days.

(21) Appl. No.: 14/487,961

(22) Filed: Sep. 16, 2014

(65) Prior Publication Data
US 2015/0097170 A1 Apr. 9, 2015

(30) Foreign Application Priority Data
Oct. 8, 2013 (KR) ........................ 10-2013-0119969

(51) Int. Cl.
*H01L 29/08* (2006.01)
*H01L 51/05* (2006.01)
*G11C 13/00* (2006.01)
*H01L 51/00* (2006.01)

(52) U.S. Cl.
CPC ........ *H01L 51/0591* (2013.01); *G11C 13/0014* (2013.01); *H01L 51/0529* (2013.01); *H01L 51/0036* (2013.01)

(58) Field of Classification Search
CPC .......................... H01L 21/28282; H01L 51/05
See application file for complete search history.

(56) References Cited

U.S. PATENT DOCUMENTS

2002/0195644 A1* 12/2002 Dodabalapur ......... B82Y 10/00
257/314

FOREIGN PATENT DOCUMENTS

KR 10-2005-0111582 A 11/2005
KR 10-2007-0115441 A 6/2007
KR 10-2011-0092758 A 8/2011

OTHER PUBLICATIONS

Baek, Sungsik et al., "Novel Digital Nonvolatile Memory Devices Based on Semiconducting Polymer Thin Films," Advanced Functional Materials, 2007, 17, pp. 2637-2644.
Kim, Jiyoun et al., "Novel Electrical Properties of Nanoscale Thin Films of a Semiconducting Polymer: Quantitative Current-Sensing AFM Analysis," American Chemical Society, 2007, 23, pp. 9024-9030.
Nam, Sungho et al., "Doping Effect of Organosulfonic Acid in Poly(3-hexylthiophene) Films for Organic Field-Effect Transistors," American Chemical Society, Applied Materials & Interfaces, 2012, 4, pp. 1281-1288.

* cited by examiner

*Primary Examiner* — Elias M Ullah
(74) *Attorney, Agent, or Firm* — Lewis, Reese & Nesmith, PLLC

(57) ABSTRACT

A non-volatile memory device includes a gate electrode, a data storage layer provided on the gate electrode, and a source electrode and a drain electrode provided on the data storage layer and spaced apart from each other. The data storage layer comprises three layers that form hetero-interfaces and have different permittivities from one another.

13 Claims, 19 Drawing Sheets

NON-VOLATILE MEMORY DEVICE AND METHOD OF MANUFACTURING THE SAME

CROSS-REFERENCE TO RELATED APPLICATIONS

This U.S. non-provisional patent application claims priority under 35 U.S.C. §119 of Korean Patent Application No. 10-2013-0119969, filed on Oct. 8, 2013, the entire contents of which are hereby incorporated by reference in their entirety.

BACKGROUND

The present invention disclosed herein relates to non-volatile memory devices and methods of manufacturing the same, and more particularly, to non-volatile memory devices having a data storage layer that is formed of an organic layer and methods of manufacturing the non-volatile memory device.

Typical inorganic memory devices intrinsically have insufficient flexibility and must be processed in a relatively high temperature range. In contrast, since organic memory devices have a potential capable of manufacturing a flexible lightweight plastic memory module at a lower temperature and a lower cost, a great deal of research into the organic memory devices has been conducted. Among various types of the organic memory devices, recent studies have been related to non-volatile memory devices including an organic-resistive-switching diode memory and an organic field-effect transistor (OFET) memory. The organic-resistive-switching diode memory devices may comprise an organic-resistive layer between two electrodes and may generally operate as one of an electrically insulating material or an electrically conductive material under appropriate voltage conditions. However, since the organic-resistive-switching diode memory devices do not have a third electrode addressing a signal, transistors addressing signals in two-dimensional memory arrays are required. Alternatively, since the OFET memory devices have three electrodes in unit transistors, the OFET memory devices may address signals alone.

The OFET memory devices may be categorized into two types according to a memory effect. The first type is a ferroelectric OFET memory device and the second type is a charge-storage OFET memory device. Functionality of the ferroelectric OFET memory devices is generated from ferroelectric gate dielectric layers that are polarized under a predetermined electric field (gate voltage), and accordingly, a research objective is to maintain a polarized state in a continuous (repetitive) reading operation. With respect to the charge-storage OFET memory device, the gate dielectric layers having functional groups may be charged to control a gate voltage. In order to facilitate switching, an additional dielectric layer may be inserted between the gate dielectric layer and an organic semiconductor layer. However, it is not good to use double dielectric layers in terms of the fact that the difference in permittivity between two layers is substantially limited because high-k polymer materials are insufficient.

SUMMARY

The present invention provides a non-volatile memory device having stability as well as excellent write-read-erase functions.

The present invention also provides a method of manufacturing the non-volatile memory device.

Embodiments of the present invention provide non-volatile memory devices including: a gate electrode; a data storage layer provided on the gate electrode; and a source electrode and a drain electrode which are provided on the data storage layer and spaced apart from each other, wherein the data storage layer comprises three layers which form hetero-interfaces and have different permittivities from one another.

In some embodiments, the layers of the data storage layer may be a gate dielectric layer, an interlayer, and an organic semiconductor layer, which are sequentially stacked on the gate electrode and each have a different dielectric constant from one another. The dielectric constant of the interlayer may be greater than the dielectric constant of the gate dielectric layer and the dielectric constant of the organic semiconductor layer.

In other embodiments, the dielectric constant of the interlayer may be in a range of about 12 to about 16, and the dielectric constants of the gate dielectric layer and the organic semiconductor layer may be each in a range of about 1 to about 5.

In still other embodiments, the interlayer may include a self-doped polymer and for example, may include a self-doped aniline derivative. The gate dielectric layer may include an organic polymer and for example, may be poly(vinyl phenol)-methylated poly(melamine-co-formaldehyde).

In even other embodiments, the organic semiconductor layer may include an organic polymer, and for example, may include poly(3-hexylthiophene).

In other embodiments of the present invention, methods of manufacturing a non-volatile memory device include: forming a gate electrode on a substrate; forming a data storage layer including hetero-interfaces having different dielectric constants therein on the gate electrode; and forming a source electrode and a drain electrode on the data storage layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 16b illustrates changes in drain current of the OFET device according to the embodiment of the present invention in the first 10 cycles (upper graph) and the last 10 cycles (lower graph) in FIG. 16a;

DETAILED DESCRIPTION OF THE EMBODIMENTS

Figure 1:
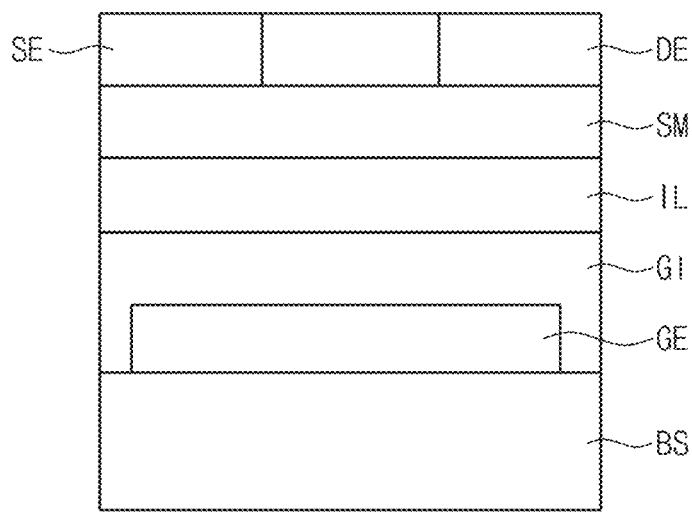
FIG. 1 is a cross-sectional view illustrating a non-volatile memory device according to an embodiment of the present invention.

While the invention is amenable to various modifications and alternative forms, specific embodiments have been shown by way of example in the drawings and are described in detail below. The intention, however, is not to limit the invention to the particular embodiments described. On the contrary, the invention is intended to cover all modifications, equivalents, and alternatives falling within the scope of the invention as defined by the appended claims.

In the drawings, like reference numerals refer to like elements throughout. Sizes of elements in the drawings may be exaggerated for clarity of illustration. Also, though terms like "first" and "second" are used to describe various components, the components are not limited to these terms. These terms are used only to differentiate one component from another one. For example, a component referred to as a first component in an embodiment can be referred to as a second component in another embodiment. In a similar manner, a second component can be referred to as a first component. The terms of a singular form may include plural forms unless otherwise specified.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, when an element such as a layer, film, region, or substrate is referred to as being "on" another element, it can be directly on the other element or intervening elements may also be present. In contrast, when an element such as a layer, film, region, or substrate is referred to as being "under" another element, it may be directly under the other element or intervening elements may also be present.

FIG. 1 is a cross-sectional view illustrating a non-volatile memory device according to an embodiment of the present invention.

Referring to FIG. 1, the non-volatile memory device according to the embodiment of the present invention includes a gate electrode GE, a data storage layer, a source electrode SE, and a drain electrode DE.

The gate electrode GE is provided on a base substrate BS. The base substrate BS may comprise a silicon substrate, a glass substrate, or a plastic substrate. The base substrate BS may be transparent or opaque.

The gate electrode GE may comprise a conductive material, for example, metal, metal oxide, or a conductive polymer. The gate electrode GE, for example, may comprise at least one of metal, conductive metal oxide, or a conductive polymer. The metal may include at least one of gold (Au), silver (Ag), copper (Cu), aluminum (Al), titanium (Ti), TiN, TiAlN, tantalum (Ta), TaN, tungsten (W), WN, iridium (Ir), platinum (Pt), palladium (Pd), zirconium (Zr), rhodium (Rh), nickel (Ni), cobalt (Co), chromium (Cr), tin (Sn), zinc (Zn), lithium (Li), magnesium (Mg), calcium (Ca), and $IrO_2$, an oxide thereof, or an alloy including these materials. Also, the source electrode SE and the drain electrode DE may comprise a multi-layer that is formed of the metal, the metal oxide, or the alloy including these materials. According to an embodiment of the present invention, the gate electrode GE may comprise indium tin oxide (ITO).

The data storage layer is formed of a plurality of layers forming hetero-interfaces. The plurality of layers may be three layers having different permittivities (or different dielectric constants). The three layers may be a gate dielectric layer GI, an interlayer IL, and an organic semiconductor layer SM which are sequentially stacked on the gate electrode GE. Hetero-interfaces are formed between the gate dielectric layer GI and the interlayer IL and between the interlayer IL and the organic semiconductor layer SM.

The gate dielectric layer GI insulates the gate electrode GE and the source and drain electrodes SE and DE. The gate dielectric layer GI may comprise an organic polymer. A dielectric constant of the gate dielectric layer GI may be in a range of about 1 to about 5.

According to an embodiment of the present invention, the gate dielectric layer GI may include poly(vinyl phenol)-methylated poly(melamine-co-formaldehyde) (PVP-MMF), polystyrene (PS), poly(α-methylstyrene) (PaMS), poly(2-vinyl naphthalene) (PVN), poly(4-vinyl phenol) (PVP), poly (2-vinyl pyridine) (PVPyr), poly(methyl methacrylate) (PMMA), or polyimide, and a dielectric constant (k) of the PVP-MMF is 4.1.

The interlayer IL may also comprise an organic polymer. A dielectric constant of the interlayer IL is greater than the dielectric constant of the gate dielectric layer GI. According to an embodiment of the present invention, the dielectric constant of the interlayer IL may be greater than the dielectric constant of the gate dielectric layer GI by about 7 to about 15, wherein, according to an embodiment of the present invention, the dielectric constant of the interlayer IL may be in a range of about 12 to about 16.

The interlayer IL may comprise a polymer, for example, a self-doped polymer and/or a polyacetylene derivative. Self-doped poly(o-anthranilic acid) (SD-PARA) may be used as the self-doped polymer. A dielectric constant of the poly(o-anthranilic acid) is 14. However, the polymer is not limited thereto, and may be replaced by an equivalent having the same or similar dielectric constant.

The organic semiconductor layer SM may comprise an organic polymer. A dielectric constant of the organic semiconductor layer SM is smaller than the dielectric constant of the interlayer IL. The dielectric constant of the organic semiconductor layer SM may be the same or similar to the dielectric constant of the gate dielectric layer GI, wherein the dielectric constant of the gate dielectric layer GI, for example, may be in a range of about 1 to about 5.

The organic semiconductor layer SM may comprise a polymer having semiconductor properties, such as poly(benzhothiadiazole) (PBTZ), poly(cyclopentadithiophene) (PCDT), poly(p-phenylene vinylene) (PPV), polytriarylamines (PTAA), poly(indacenodithiophene) (PIDT), poly(perylene diimide-thieno-dithiophene), poly(naphthalene dicarboximide), poly(3,3-didodecylquaterthiophene (PQT12), poly(2,5-bis(3-alkylthiophene-2-yl)thieno[3,2-b] thiophenes) (pBTTT), and/or poly(3-hexylthiophene) (P3HT), or a derivative thereof. Herein, a dielectric constant of the P3HT is 2.0.

The source electrode SE and the drain electrode DE, for example, may comprise at least one of conductive materials such as metal, conductive metal oxide, or a conductive polymer. The metal may include at least one of Au, Ag, Cu, Al, Ti, TiN, TiAlN, Ta, TaN, W, WN, Ir, Pt, Pd, Zr, Rh, Ni, Co, Cr, Sn, Zn, Li, Mg, Ca, and $IrO_2$, an oxide thereof, or an alloy including these materials. Also, the source electrode SE and the drain electrode DE may comprise a multi-layer that is formed of the metal, the metal oxide, or the alloy including these materials. According to an embodiment of the present invention, the source electrode SE and the drain electrode DE may comprise silver.

The gate electrode GE is formed on a substrate, a data storage layer including hetero-interfaces having different dielectric constants therein is formed on the gate electrode GE, and a non-volatile memory device having the above structure may then be manufactured by forming the source electrode SE and the drain electrode DE on the data storage layer.

The gate electrode GE may be formed by forming a conductive layer on the base substrate BS and patterning the conductive layer using photolithography.

The data storage layer may be formed by sequentially coating polymers having different dielectric constants. For example, the data storage layer may comprise three layers, that is, the gate dielectric layer GI, the interlayer IL, and the organic semiconductor layer SM. After coating a fluid including a monomer or a precursor constituting each polymer, the three layers may be prepared by curing and polymerizing the coated fluid. However, a method of forming the data storage layer is not limited thereto. The data storage layer may be formed by a deposition method or may be formed by being laminated with separated films which are formed of a material constituting the layer.

A conductive layer is formed, and the source electrode SE and the drain electrode DE may be formed by pattering the conductive layer using photolithography.

According to an embodiment of the present invention, it is suggested that the non-volatile memory device has a bottom-gate type structure. However, the present invention is not limited thereto, and the non-volatile memory device may have a top-gate type structure while maintaining the concept of the present invention.

The above-described non-volatile memory device according to the embodiment of the present invention has a charge-trapping polymer energy well (PEW) structure, and thus, charges (electrons/holes) generated by a field-effect operation may be effectively stored through the arrangement of the polymer layers having different dielectric constants in the data storage layer.

Figure 2:
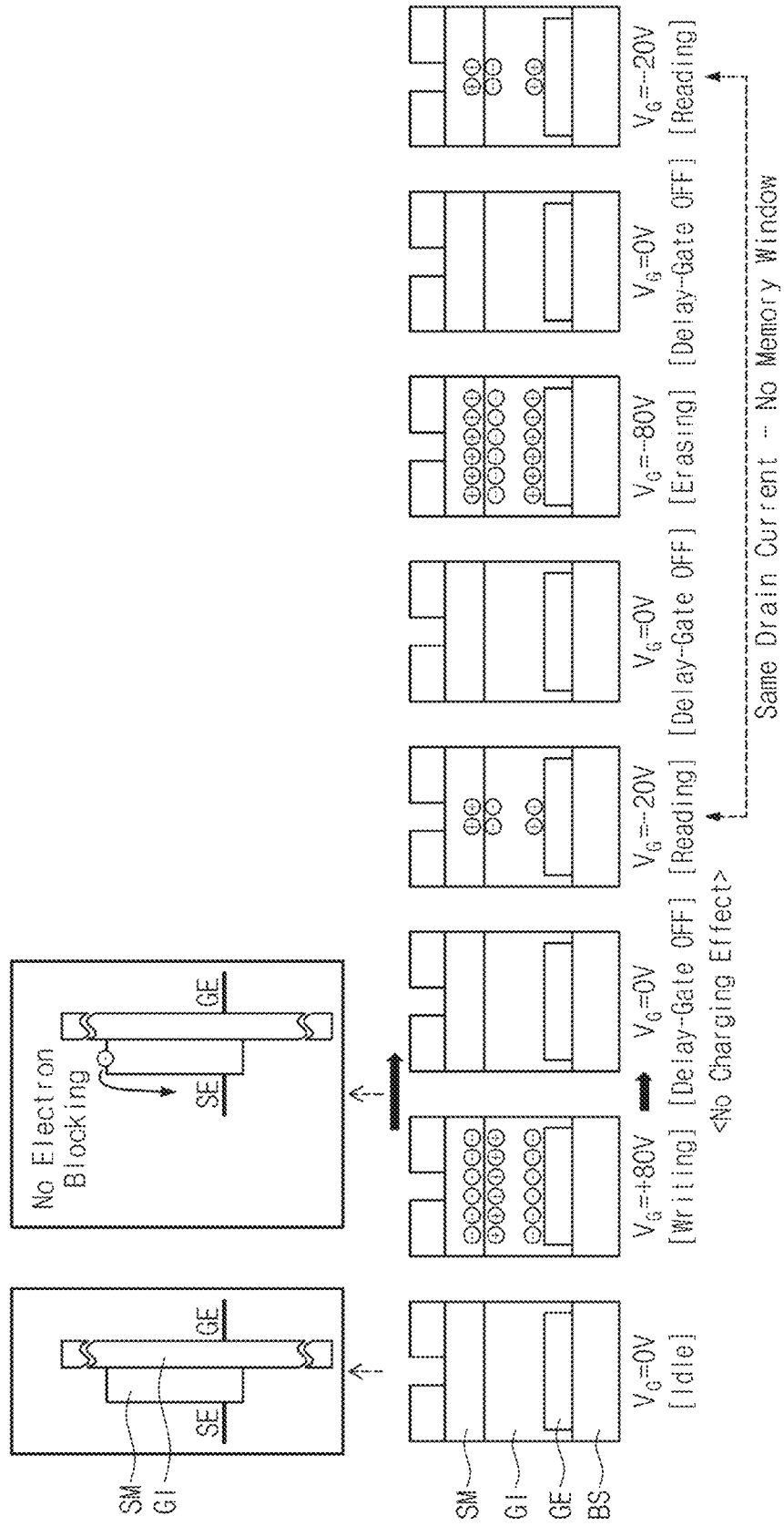
FIG. 2 is a conceptual view illustrating a driving mechanism of an organic field-effect transistor (OFET) device without an interlayer formed of self-doped poly(o-anthranilic acid) (SD-PARA)

FIG. 2 is a conceptual view illustrating a driving mechanism of an organic field-effect transistor (OFET) device without the interlayer IL.

Referring to FIG. 2, the OFET without the interlayer IL has only a single interface between the gate dielectric layer GI and the organic semiconductor layer SM. Therefore, in a case where the OFET has such a structure, since a difference between dielectric constants of two layers may prevent from sufficiently storing charges when driving a memory, sufficient charge storage may not be expected for devices having such a structure. As a result, the OFET device without the interlayer IL has no memory effect.

Figure 3:
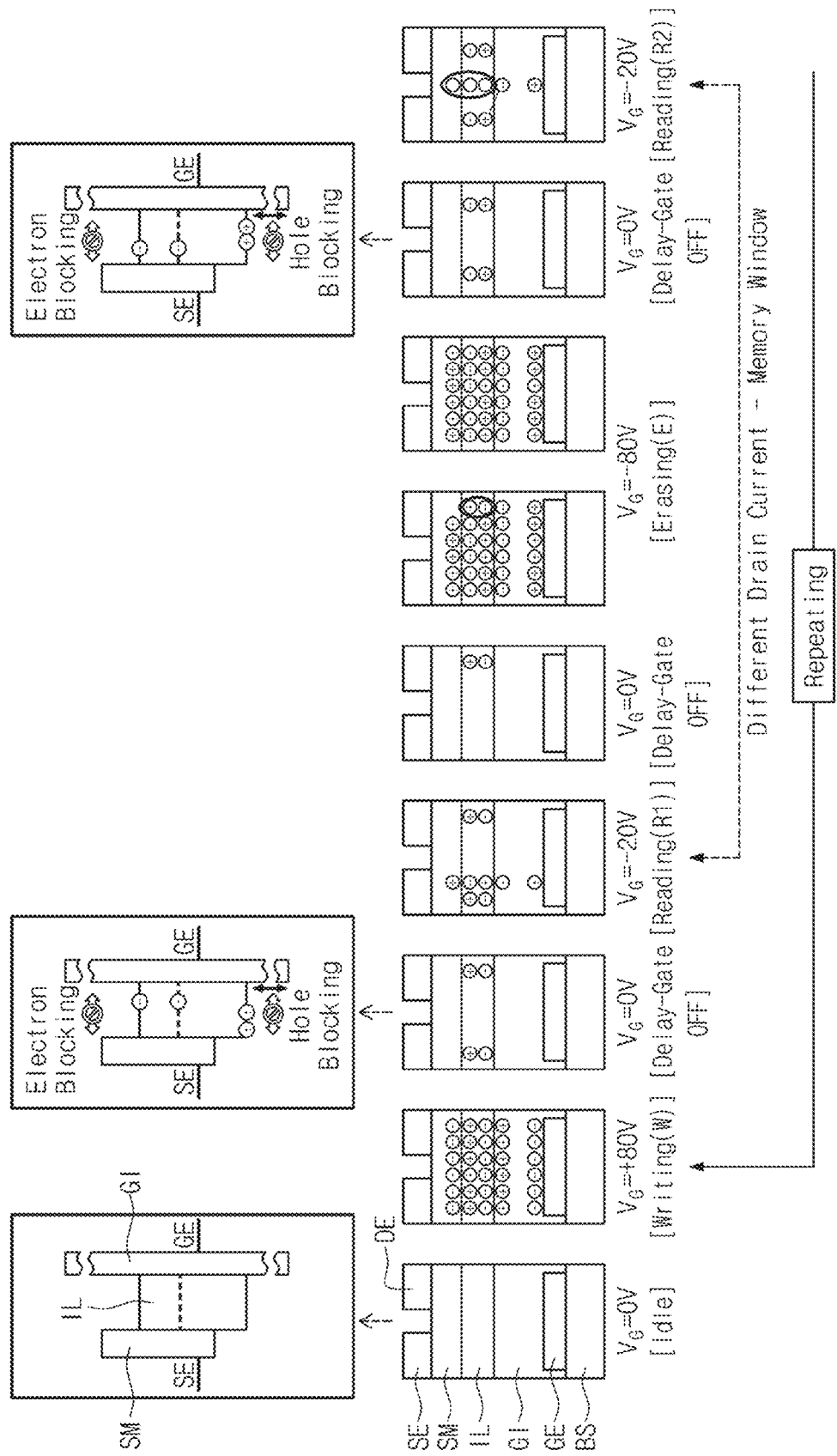
FIG. 3 illustrates a driving mechanism of an OFET device according to an embodiment of the present invention.

FIG. 3 illustrates a driving mechanism of an OFET device according to an embodiment of the present invention and specifically, is a conceptual view illustrating the driving mechanism of the OFET device including the interlayer IL. In FIG. 3, EW, CR, RP, PP, and NP respectively represent "energy well", "charge recombination loss", "strong reverse polarization", "polarization prevention in accordance with positive charges", and "no polarization and no charge generation". The state of charges including electrons and holes is presented as an energy band diagram.

Referring to FIG. 3, the OFET having the interlayer IL may have hetero-interfaces between the organic semiconductor layer SM and the interlayer IL, and between the interlayer IL and the gate dielectric layer GI.

Referring to the energy band diagram of FIG. 3, the OFET has large highest occupied molecular orbital (HOMO) and lowest occupied molecular orbital (LUMO) band energy offsets, and a large band gap of the gate dielectric layer GI. Accordingly, the OFET has a charge-trapping energy well structure in which charges trapped in the interlayer IL may be effectively trapped in the interlayer IL. The trapped charges are electrons and holes which are generated by field effect That is, a large energy barrier to the charges may prevent the transfer of the charges from a LUMO (HOMO for holes) of the interlayer IL to a LUMO (HOMO for holes) level of the organic semiconductor layer SM.

Specifically, in the interlayer IL and the organic semiconductor layer SM, the LUMO of the interlayer IL has a lower value than the LUMO of the organic semiconductor layer SM. A difference between the LUMO of the interlayer IL and the LUMO of the organic semiconductor layer SM is a sufficiently large value to prevent the transfer of electrons and the difference between the two LUMO values may act as a barrier to the transfer of electrons. Accordingly, when electrons are once located in the interlayer IL, the transfer of the electrons to the organic semiconductor layer SM is blocked and the electrons are stored in the interlayer IL.

Similarly, the HUMO of the interlayer IL has a larger value than the HUMO of the organic semiconductor layer SM. A difference between the HUMO of the interlayer IL and the HUMO of the organic semiconductor layer SM is a sufficiently large value to prevent the transfer of holes and the difference between the two HUMO values may act as a barrier to the transfer of holes. Accordingly, when holes are once located in the interlayer IL, the transfer of the holes to the organic semiconductor layer SM is blocked and the holes are stored in the interlayer IL.

Herein, some charges may be lost by coulomb recombination between the electrons and the holes in the interlayer IL. In addition to the charge-trapping energy well mechanism, since the interlayer IL has a high k value due to the partially self-doped sites, a space-charge polarization phenomenon may contribute to the charging phenomenon. The layers having a low k value (the organic semiconductor layer SM and the gate dielectric layer GI) may safely maintain the trapped charges, in order for the trapped charges not to be seriously lost by diffusion through leakage paths that may occur in a low/high/low dielectric structure.

Referring again to FIG. 3, the OFET device according to the present embodiment may have the following driving mechanism. When performing a write operation (W) at a gate voltage of +80 V, strong polarization occurs to generate holes and electrons in the interlayer IL and electrons are generated in the organic semiconductor layer SM. The electrons in the organic semiconductor layer SM are lost due to fast electron transfer to a metal (Ag) electrode after removing the gate voltage $V_G$. However, the charges of the interlayer IL are trapped as described above due to the large energy barrier in the charge-trapping PEW structure.

Next, when a gate voltage ($V_G$) of −20 V is applied when performing a first read operation ($R_1$), a weak polarization phenomenon may be induced reversely to the write operation (W), and a portion of the charges trapped in the interlayer IL may be lost by charge recombination. When a gate voltage ($V_G$) of −80 V is applied for an erase operation (E), the trapped charges remaining in the interlayer IL are removed due to strong polarization effects. Thereafter, charges are again trapped in the interlayer IL. However, the arrangement (direction) of the charges is opposite to the case of the write operation (W). In this case, since it may not sufficiently polarize the trapped holes (i.e., electron empty state) in the interlayer IL when a gate voltage ($V_G$) of −20 V is applied for a second read operation ($R_2$), holes are almost not generated in the organic semiconductor layer SM. Thus, a current in the second read operation ($R_2$) is significantly lower than a current in the first read operation ($R_1$) and a memory window is formed.

Therefore, the non-volatile memory device according to the embodiment of the present invention having the above structure may exhibit excellent write-read-erase functions and excellent stability (data retention). Herein, each gate voltage is provided as an example, the present invention is not limited thereto. The gate voltages having values different from those of the above gate voltages may be applied in the limit in which each operation may be performed.

Consequently, the OFET memory device according to the embodiment of the present invention corresponds to a charge-storage OFET memory device having the partially charged (with permanent charges) polymer interlayer IL between the gate dielectric layer GI and the organic semiconductor layer SM. Since the OFET memory device according to the embodiment of the present invention has significantly higher polarizability than typical polar polymers without ionic charges, the OFET memory device may store more charge carriers that are generated by a field effect phenomenon. In addition, the OFET memory devices having the above structure may have a polymer energy well structure formed by the partially charged interlayer IL having energy band levels (LUMO and HOMO) that are significantly different from those of the polymer layers (the gate dielectric layer GI and the organic semiconductor layer SM) adjacent to each other. Consequently, since a high energy barrier (high energy barriers) around the energy well in the OFET having a PEW structure may prevent the transfer of charges, the charge carriers generated during a field-effect operation may be stably stored in the PEW.

According to an embodiment of the present invention, the self-doped poly(o-anthranilic acid) (SD-PARA), as described above, may be used as the partially charged interlayer IL. The reason for this is that the SD polymer is strong against all device performance degradations which may occur due to the movement of guest dopant molecules doped with polymers when external guest dopants are used. Herein, it must be noted that polar dopant molecules may be moved under a high electric field in a writing operation.

In addition, since the OFET device according to the embodiment of the present invention may include P3HT as the organic semiconductor layer SM and PVP-MMF as the gate dielectric layer GI, the OFET memory device including SD-PARA, P3HT, and PVP-MMF may exhibit a significant hysteresis in comparison to the case in which an OFET memory device without a SD-PARA layer does not almost exhibit a hysteresis. Also, hole mobility of the OFET device may be significantly changed (orders of magnitude of about 10) according to a charge-discharge operation (forward-backward direction sweep voltage of gate voltage).

While the invention has been particularly shown and described with reference to exemplary embodiments thereof, it will be understood by those of ordinary skill in the art that various changes in form and details may be made therein without departing from the spirit and scope of the invention as defined by the following claims. Therefore, the scope of the invention is defined not by the detailed description of the invention but by the appended claims.

Example 1

Data Storage Layer Material

According to an embodiment of the present invention, poly(vinyl phenol) (PVP) and methylated poly(melamine-co-formaldehyde) (MMF) were used as a gate dielectric layer, wherein the PVP and the MMF were purchased from Sigma-Aldrich Co. (St. Louis, Mo., USA). A weight-average molecular weight ($\overline{Mw}$) of the PVP was $2.5 \times 10^4$, and a weight-average molecular weight ($\overline{Mw}$) of the MMF was 432. According to an embodiment of the present invention, the PVP and MMF materials were used without purification.

Self-doped poly(o-anthranilic acid) (SD-PARA) was used as an interlayer, wherein the SD-PARA polymer is expressed by Chemical Formula 1 below.

[Chemical Formula 1]

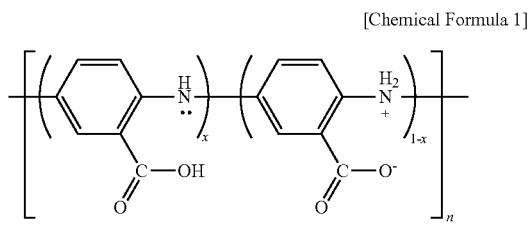

The SD-PARA was synthesized by a typical method published in related articles (Baek, S., Lee, D., Kim, J., Hong, S. H., Kim, O., and Ree, M., Novel digital nonvolatile memory devices based on semiconducting polymer thin films, *Adv. Funct. Mater.* 17, 2637-2644 (2007); Kim, J., Cho, S., Choi, S., Baek, S., Lee, D., Kim, O., Park, S. M., and Ree, M., Novel electrical properties of nanoscale thin films of a semiconducting polymer: quantitative current-sensing AFM analysis. *Langmuir.* 23, 9024-9030 (2007).).

An intrinsic viscosity ($\eta$) of the SD-PARA polymer product measured was 0.11 dlg$^{-1}$ in N-methyl-2-pyrrolidone at 25° C. when using an Ubbelohde capillary viscometer (Fungilab, Sant Felin de Volgregat, Barcelona, Spain).

Poly(3-hexylthiophene) (P3HT) was used as an organic semiconductor layer, wherein the P3HT made by Lumtec (Science-Based Industrial Park, Hsin-Chu, Taiwan) was used and is expressed by Chemical Formula 2 below.

[Chemical Formula 2]

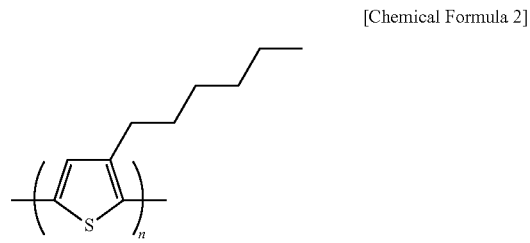

A weight-average molecular weight ($\overline{Mw}$) of the P3HT was 6.0×10$^4$, a polydispersity index was 2.0, and a regioregularity was 95%.

Example 2

Manufacturing of Non-Volatile Memory Device

A glass substrate was used as a base substrate, and a gate electrode formed of indium tin oxide (ITO) was formed on the base substrate using a photolithography technique. The gate electrode was formed in the shape of a stripe having a size of 1 mm×12 mm.

Thereafter, the base substrate having the gate electrode formed thereon was wet cleaned using acetone and isopropyl alcohol, and then dry cleaned using ultraviolet ozone.

Next, a PVP-MMF thin film was formed as a gate dielectric layer. The PVP-MMF thin film was formed by spin coating the cleaned base substrate with a PVP-MMF (PVP+MMF) precursor and thermal curing at 250° C. for 60 minutes. The PVP-MMF thin film was insoluble and the thickness thereof was about 600 nm Thereafter, an SD-PARA thin film was formed as an interlayer, wherein the PVP-MMF film was spin-coated with SD-PARA and the SD-PARA thin film was formed by soft baking the base substrate coated with an SD-PARA layer at 50° C. A thickness of the SD-PARA thin film was about 100 nm.

Subsequently, a P3HT thin film was formed as an organic semiconductor layer, wherein P3HT was spin-coated.

Finally, silver was deposited to form a source electrode and a drain electrode using a shadow mask. In this case, the source electrode and the drain electrode were formed to have a channel having a length of 70 μm and a width of 3 mm.

A non-volatile memory device manufactured by the above-described method was stored in a nitrogen-charged glove box before characterization.

Separately from the non-volatile memory device, a diode-type device was formed in order to measure conductivities in a planar direction and a vertical direction of the interlayer. An SD-PARA thin film was formed on a base substrate having an ITO electrode formed thereon by spin coating and an electrode was directly deposited on the SD-PARA thin film using aluminum in vacuum. Then, the diode-type device was formed by soft baking the product thus obtained at 50° C. Accordingly, the diode-type device was fabricated to have a structure in which the ITO electrode/SD-PARA thin film/Al electrode were sequentially stacked.

In order to measure permittivity of materials constituting the data storage layer, a diode-type device was formed for each material. A P3HT thin film, an SD-PARA thin film, and a PVP-MMF thin film were respectively formed on base substrates having an ITO electrode formed thereon. Then, the diode-type devices were formed by soft baking the P3HT thin film and the SD-PARA thin film at 50° C. and curing the PVP-MMF thin film at 250° C. for 60 minutes. Next, the base substrates having the thin film formed thereon were transferred to a nitrogen-charged glove box and an aluminum electrode was then deposited in vacuum. The diode devices (ITO/P3HT/Al and ITO/SD-PARA/Al) having the P3HT thin film and the SD-PARA thin film among the above diode devices were thermally annealed at 120° C. for 30 minutes before the measurement of dielectric constant (impedance).

Example 3

Non-Volatile Memory Device Test Method

Optical absorption spectra of the SD-PARA thin film, the P3HT thin film, and the P3HT-coated SD-PARA thin film were measured with an ultraviolet-visible absorption spectrophotometer (Optizen 2120UV, Mecasys, Daejeon, Republic of Korea). Ionization potential of the SD-PARA thin film coated on the ITO-glass substrate was measured with a photoelectron yield spectrometer (AC-2, Riken-Keiki, Tokyo, Japan). A J-V curve of the diode device (ITO/SD-PARA/A1) was measured with an electrometer (Keithley 2400, Keithley Instruments Inc., Cleveland, Ohio, USA) and dielectric constants of the thin film samples were measured with an impedance analyzer (VERSA STAT 4, Ametek, Berwyn, Pa., USA) (frequency sweep was performed in a frequency range of 10 Hz to 1 MHz). Transistor and memory characteristics of the OFET devices were measure with a semiconductor parameter analyzer (SCS-4200, Keithley). The measurements of all devices were performed in a nitrogen atmosphere.

Example 4

Non-Volatile Memory Device Test Results

Figure 4:
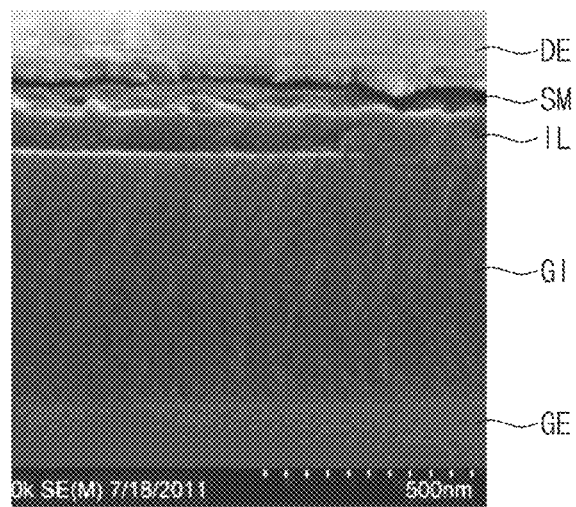
FIG. 4 is a scanning electron microscope (SEM) image illustrating the non-volatile memory device according to the embodiment of the present invention that is illustrated in FIG. 1 after manufacturing the device.

FIG. 4 is a scanning electron microscope (SEM) image illustrating the non-volatile memory device according to the embodiment of the present invention illustrated in FIG. 1 after manufacturing the device.

Figure 5:
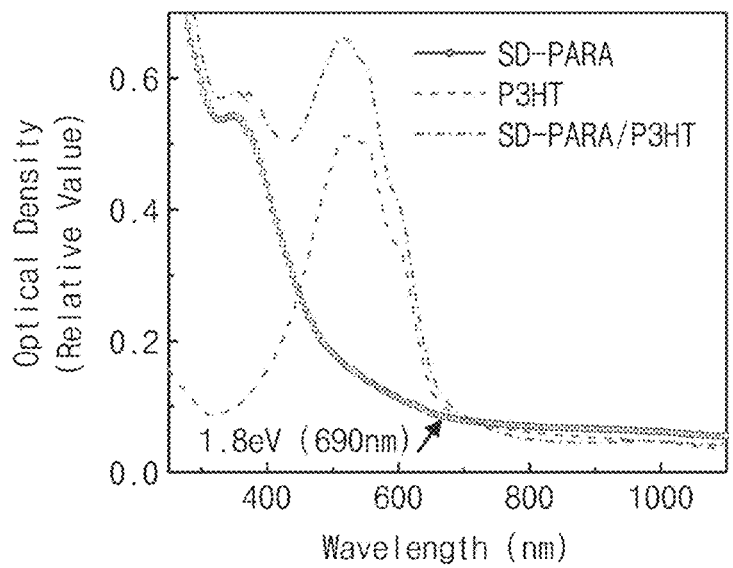
FIG. 5 illustrates optical absorption spectra of SD-PARA thin film, P3HT thin film, and P3HT-coated SD-PARA thin film.

FIG. 5 illustrates optical absorption spectra of the SD-PARA thin film, P3HT thin film, and P3HT-coated SD-PARA thin film.

Referring to FIG. 5, the SD-PARA thin film exhibited main absorbance at about 670 nm or less while exhibiting weak absorbance in a near-infrared region, and this corresponded to the self-doped region of the SD-PARA thin film. Herein, the weak absorbance in a near-infrared region was also measured after coating the SD-PARA thin film with a P3HT layer.

Figure 6:
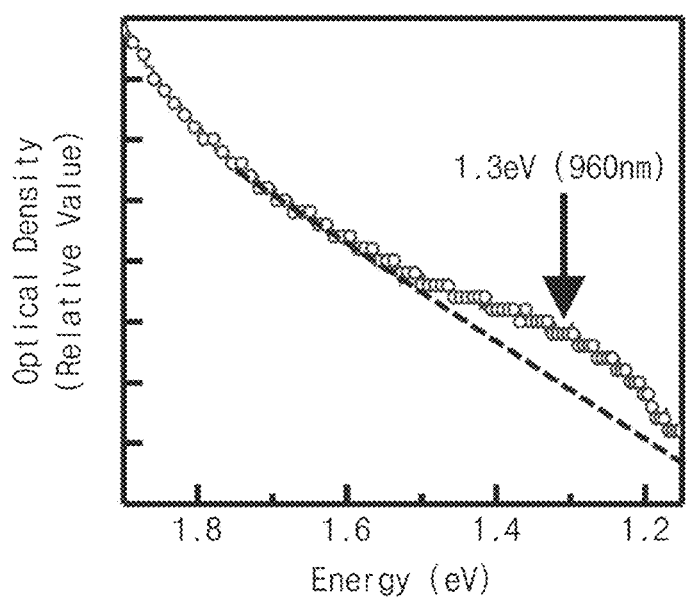
FIG. 6 is a magnified view illustrating optical density according to energy of the SD-PARA thin film to indicate a doped state in detail.

FIG. 6 is a magnified view illustrating optical density (OD) according to energy of the SD-PARA thin film to indicate a doped state in detail.

Figure 7:
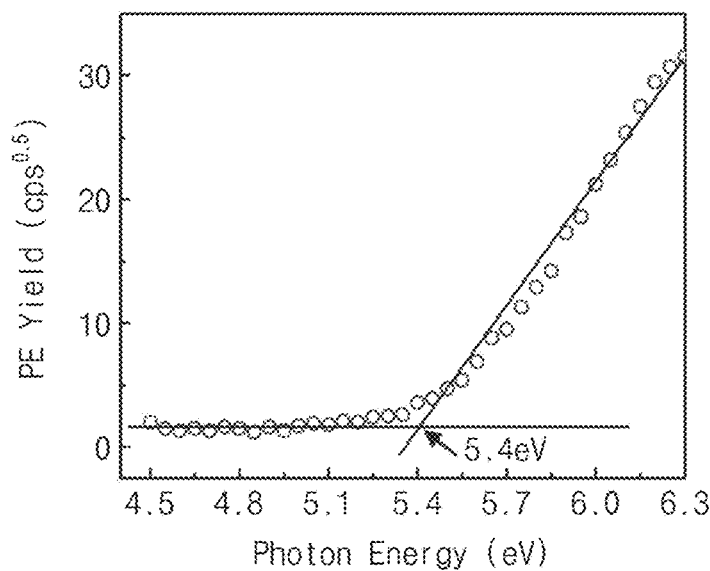
FIG. 7 illustrates a photoelectron yield spectrometer spectrum of an SD-PARA thin film formed on an indium tin oxide (ITO) base substrate.

FIG. 7 illustrates a photoelectron yield spectrometer spectrum of the SD-PARA thin film formed on an indium tin oxide (ITO) base substrate, wherein the spectrum is for measuring the ionization potential (or HOMO energy) of the SD-PARA thin film. A starting value of the photoelectron yield measured was about 5.4 eV and this value corresponded to about 5.7 eV after correction.

Figure 8:
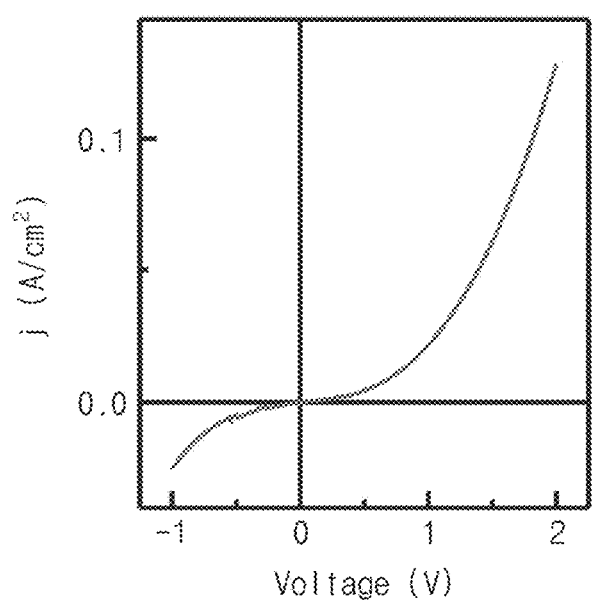
FIG. 8 is a current density-voltage (J-V) curve of a diode device having an ITO/SD-PARA/aluminum (Al) structure.

FIG. 8 is a current density-voltage (J-V) curve of the diode device having an ITO/SD-PARA/aluminum (Al) structure. Referring to FIG. 8, the SD-PARA thin film exhibited a diode-like shape of J-V characteristics and asymmetric current density between forward and backward bias, and it may be understood that the diode device was not a perfect conductor but a semiconductor.

When examined on the basis of the optical and electrical measurement results of the SD-PARA thin film, it may be confirmed that the SD-PARA film was a semiconductor thin film in which HOMO and LUMO energy levels were 5.7 eV and 3.9 eV, respectively. Herein, there existed a weak inter-band energy level (about 4.4 eV) due to a doping region (900 to 1,000 nm) of the SD-PARA thin film. Energy band diagrams of the devices according to the present embodiment may be configured according to an electric field applied between the source and drain electrodes by using such information.

Figure 9:
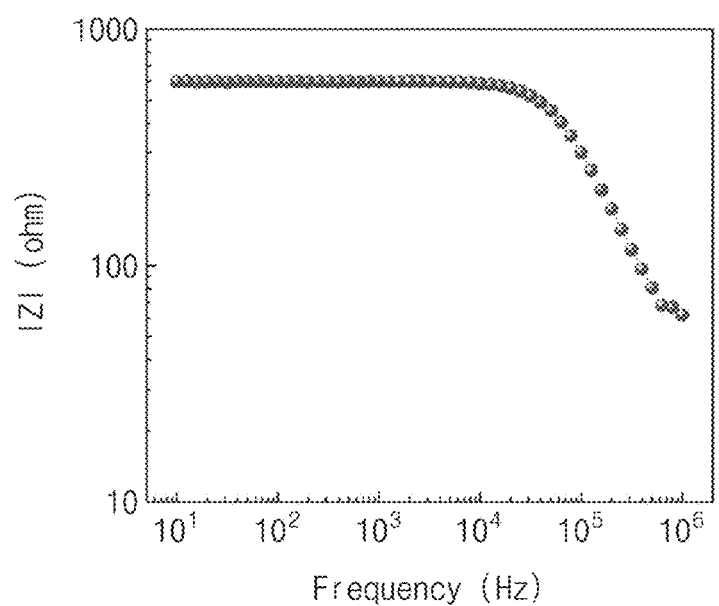
FIG. 9 is a graph illustrating impedance of the diode device having an ITO/SD-PARA/Al structure according to frequency.

FIG. 9 is a graph illustrating impedance of the diode device having an ITO/SD-PARA/Al structure according to frequency.

Figure 10A:
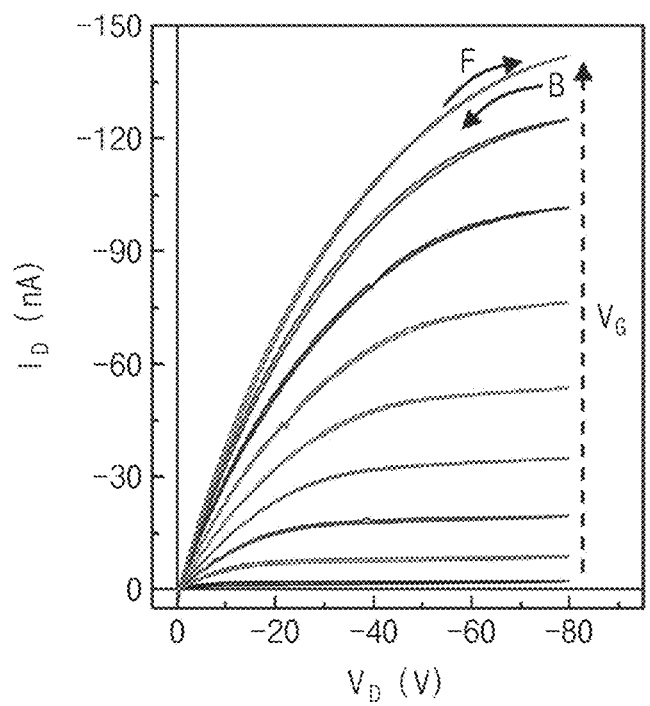
FIGS. 10a and 10b respectively illustrate output and transfer curves of an OFET without an SD-PARA layer as an interlayer.
Figure 10B:
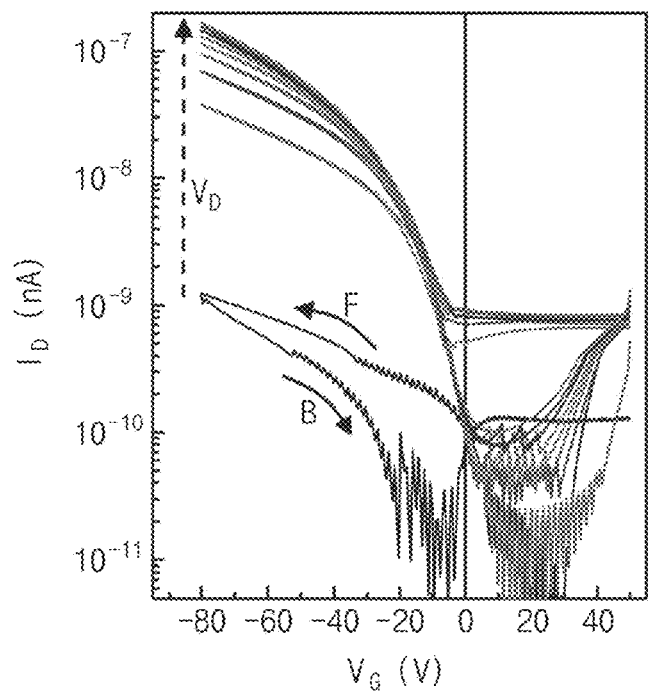
Figure 11A:
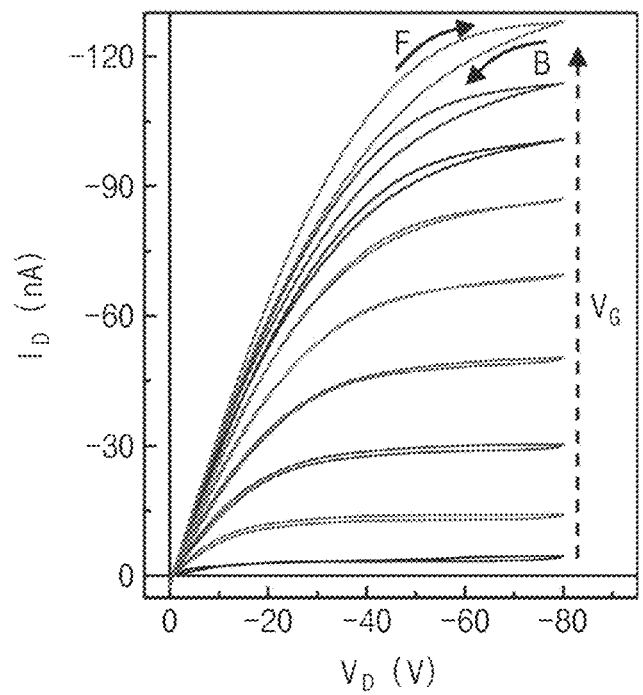
FIGS. 11a and 11b respectively illustrate output and transfer curves of an OFET device according to an embodiment of the present invention, i.e., an OFET with an SD-PARA layer as an interlayer.
Figure 11B:
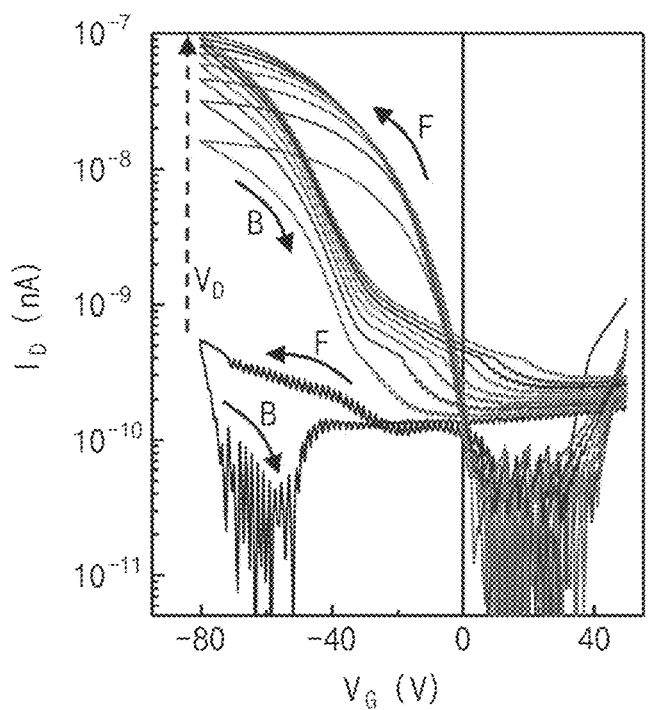

FIGS. 10a and 10b respectively illustrate output and transfer curves of an OFET without an SD-PARA layer as an interlayer, and FIGS. 11a and 11b respectively illustrate output and transfer curves of an OFET device according to an embodiment of the present invention, i.e., an OFET device with an SD-PARA layer as an interlayer. In FIGS. 10a, 10b, 11a, and 11b, F represents a forward sweep and B represents a backward sweep. In FIGS. 10a and 11a, a gate voltage ($V_G$) was increased from 0 V to −80 V in a direction of an arrow, and in FIGS. 10b and 11b, a drain voltage ($V_D$) was increased from 0 V to −80 V in a direction of an arrow.

Referring to FIGS. 10a and 10b, the OFET without an SD-PARA layer almost did not exhibit a noticeable hysteresis between the forward (gate voltage ($V_G$): +50 V to −80 V; drain voltage ($V_D$): 0 V to −80 V) or backward (gate voltage ($V_G$): −80 V to +50 V; drain voltage ($V_D$): −80 V to 0 V) sweep in the output and transfer curves.

A very small hysteresis in the output curve of FIG. 10a may be due to an effect of a polar group (—OH) remaining without a reaction in a thermal curing process, and this may be expressed by Chemical Formula 3 below.

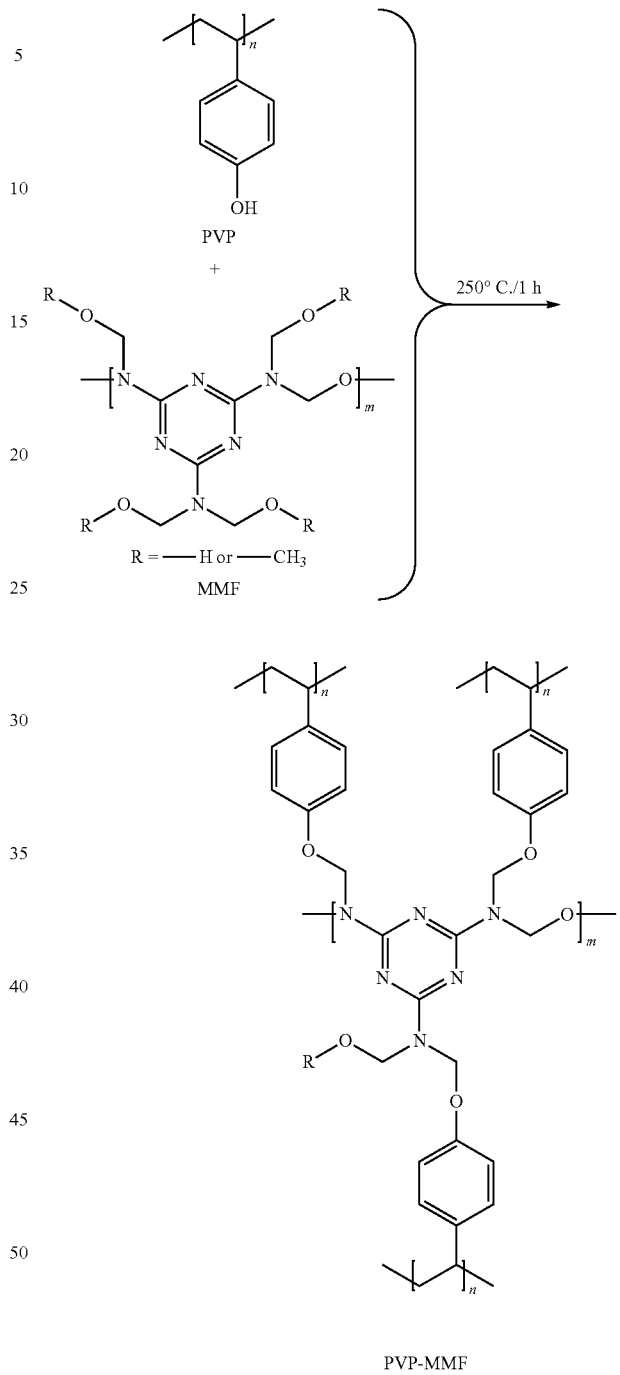

[Chemical Formula 3]

Referring to FIGS. 11a and 11b, a relatively significant hysteresis was detected in the OFET device according to the embodiment of the present invention. The hysteresis phenomenon was discovered in all output and transfer curves regardless of a voltage when a hysteresis gap according to the voltage was changed, and this denoted that the charge-trapping PEW structure of the present embodiment operated in a wide voltage range.

Herein, a difference in the degree of hysteresis between the output curve of FIG. 11a and the transfer curve of FIG. 11b may be due to charge characteristics of the device according to the embodiment of the present invention. This primarily depended on the gate voltage (between the gate electrode and the source electrode) applied to the SD-PARA layer. Herein, since a current may flow primarily through the P3HT layer as the drain voltage was applied, the SD-PARA layer may almost not be affected by the output curve.

Figure 12A:
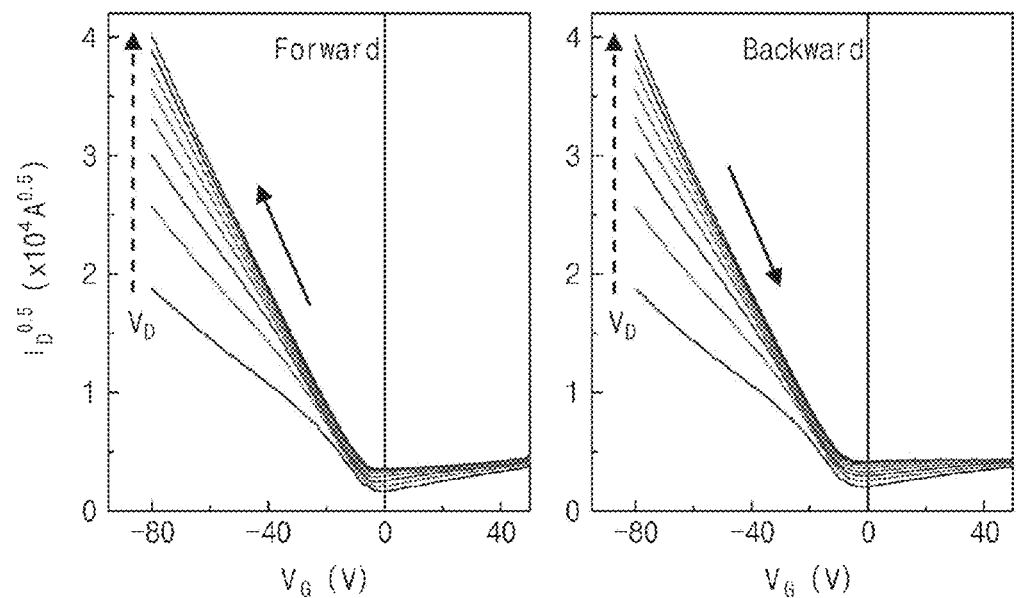
FIGS. 12a and 12b are respectively compensation graphs illustrating gate voltage vs. drain current (ID) of the OFET device without an SD-PARA layer as an interlayer and the OFET device with an SD-PARA layer as an interlayer according to the embodiment of the present invention.
Figure 12B:
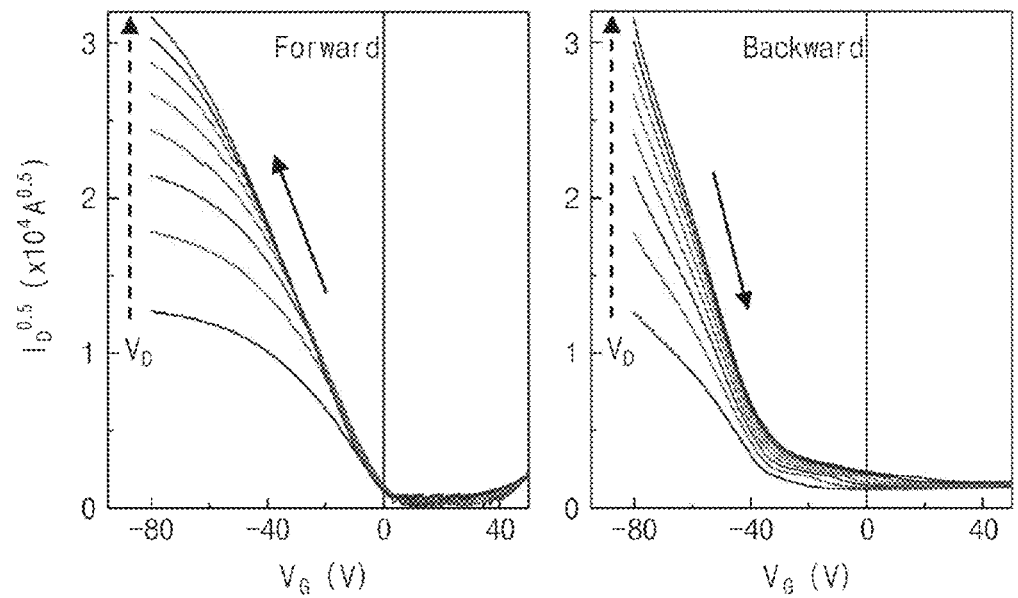

FIGS. 12a and 12b are respectively compensation graphs illustrating gate voltage vs. drain current (ID) of the OFET device without an SD-PARA layer as an interlayer and the OFET device with an SD-PARA layer as an interlayer according to the embodiment of the present invention. The compensation graphs of FIGS. 12a and 12b were provided for calculating mobility of holes, and FIGS. 12a and 12b each illustrate both forward sweep and backward sweep. Herein, the hole mobilities of the devices in forward and backward directions were calculated from the graphs.

Figure 13:
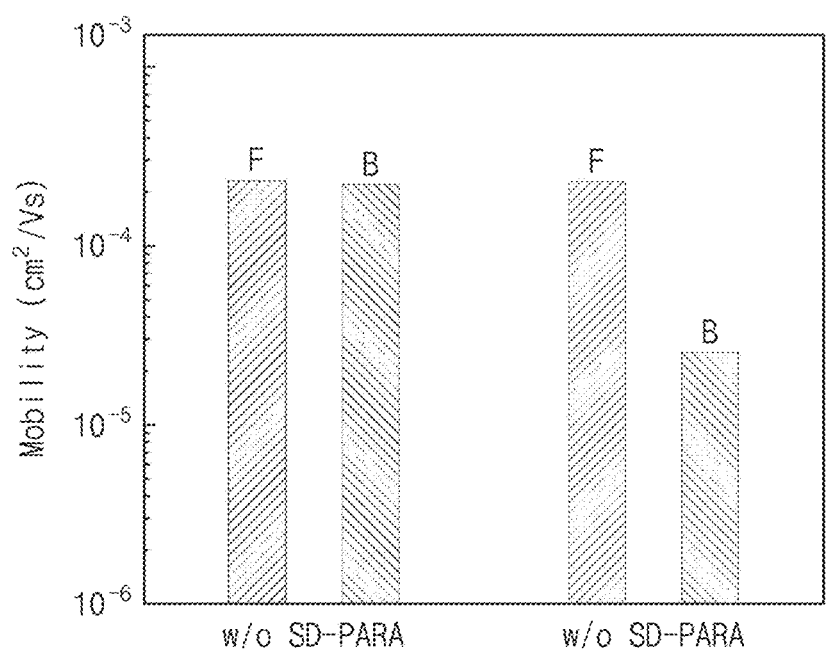
FIG. 13 is a graph comparing hole mobilities of the OFET device without an SD-PARA layer as an interlayer and the OFET device with an SD-PARA layer as an interlayer according to the embodiment of the present invention.

FIG. 13 is a graph comparing hole mobilities of the OFET device without an SD-PARA layer as an interlayer and the OFET device with an SD-PARA layer as an interlayer according to the embodiment of the present invention. In FIG. 13, F represents a forward sweep and B represents a backward sweep.

Referring to FIG. 13, the hole mobilities of the OFET without an SD-PARA layer were almost the same at both forward and backward sweep voltages. In contrast, in the OFET according to the embodiment of the present invention, the hole mobility at a backward sweep voltage was almost 10 times lower than the hole mobility at a forward sweep voltage. The large variation in the hole mobility of the OFET may indicate that the SD-PARA layer had different charged states according to the sweeping of the gate voltage in forward and backward directions. Herein, a driving voltage may be further increased according to adjusting a channel length using channel patterning such as lithography, and for example, the driving voltage may be decreased less than 3 V when the channel length reached 2 micrometers.

Figure 14A:
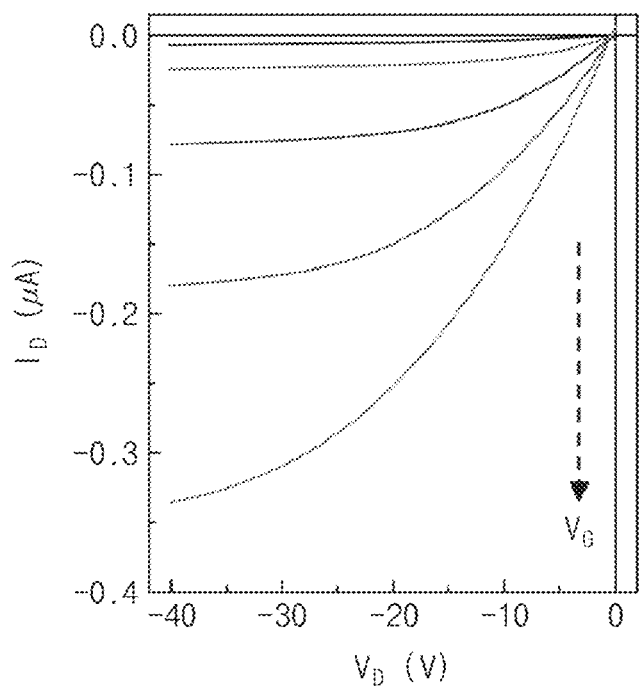
FIGS. 14a and 14b respectively illustrate output and transfer curves of an OFET device including an optimized gate dielectric layer and using P3HT as an organic semiconductor layer.
Figure 14B:
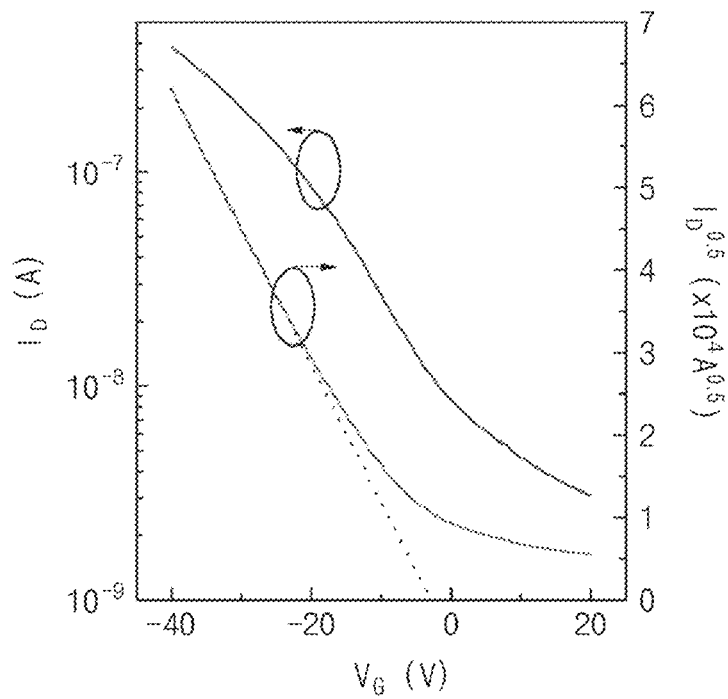

FIGS. 14a and 14b respectively illustrate output and transfer curves of an OFET device using P3HT as an organic semiconductor layer when including an optimized gate dielectric layer decreasing a driving voltage of the memory device among various dielectric layers. Herein, a gate voltage ($V_G$) of the output curve was changed from 0 V to −40 V by −10 V steps and a drain voltage ($V_D$) of the transfer curve was fixed to −20 V. A driving voltage of the device was decreased about two times.

As illustrated in FIGS. 14a and 14b, the driving voltage may be further decreased by optimizing the OFET layer using a better gate dielectric layer and using P3HT having higher regioregularity as the known information (Nam. S., Kim, J., Lee, H., Kim, H., Ha, C. S., and Kim, Y., Doping effect of organosulfonic acid in poly(3~hexylthiophene) films for organic field-effect transistors. ACS Appl. Mater. Interfaces 4, 1281-1288 (2012).).

The following Tables 1 and 2 respectively present memory characteristics of an OFET device without an SD-PARA layer as an interlayer and an OFET device with an SD-PARA layer as an interlayer according to an embodiment of the present invention. Herein, $V_D$, $V_{TH,F}$, $V_{TH,B}$, $V_{MEM}$, $R_{ON/OFF,F}$, and $R_{ON/OFF,B}$ represent drain voltage, forward sweep threshold voltage, backward sweep threshold voltage, memory window, forward sweep on/off ratio, and backward sweep on/off ratio, respectively.

TABLE 1

| $V_D$ (V) | $V_{TH,F}$ (V) | $V_{TH,B}$ (V) | $V_{MEM}$ (V) | $R_{ON/OFF,F}$ | $R_{ON/OFF,B}$ |
|---|---|---|---|---|---|
| −10 | 0 | 2 | 2 | 24435 | 82 |
| −30 | 3 | 2 | 1 | 2740 | 130 |
| −50 | 3 | 2 | 1 | 1965 | 171 |
| −80 | 3 | 2 | 1 | 1675 | 200 |

TABLE 2

| $V_D$ (V) | $V_{TH,F}$ (V) | $V_{TH,B}$ (V) | $V_{MEM}$ (V) | $R_{ON/OFF,F}$ | $R_{ON/OFF,B}$ |
|---|---|---|---|---|---|
| −10 | 5 | −28 | 33 | 33039 | 111 |
| −30 | 2 | −28 | 30 | 837637 | 263 |
| −50 | 0 | −30 | 30 | 3993 | 324 |
| −80 | −3 | −33 | 30 | 3415 | 353 |

As illustrated in Tables 1 and 2, a memory window of the OFET according to the embodiment of the present invention was in a range of 30 V to 33 V and had a significantly greater value than 1 V to 2 V of the OFET without an SD-PARA layer.

In order to investigate the memory characteristics of the OFET according to the embodiment of the present invention, the following gate voltage program was used.

Figure 15A:
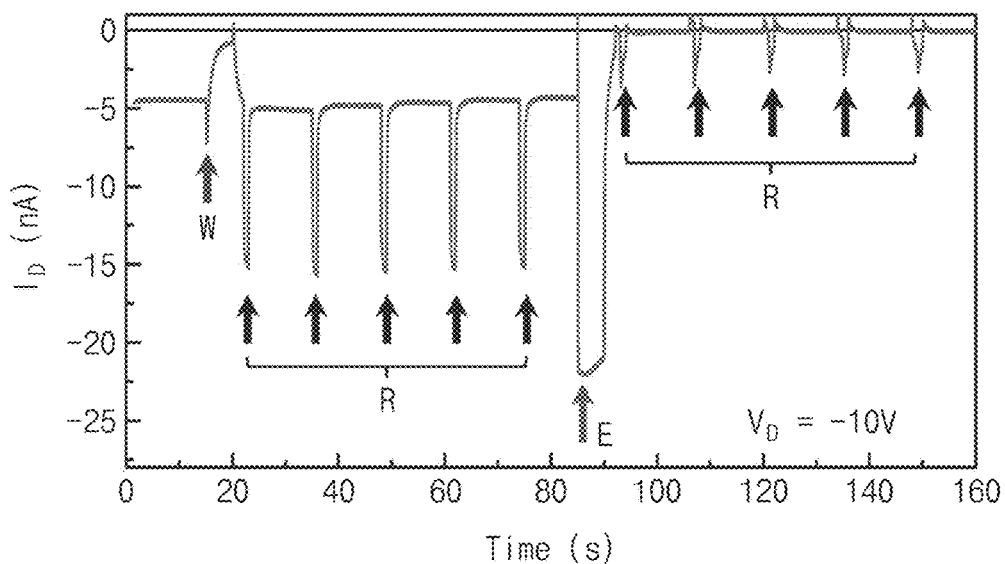
FIG. 15a illustrates write-read-erase memory operations in the OFET device according to the embodiment of the present invention.

FIG. 15a illustrates write-read-erase memory operations in the OFET device according to the embodiment of the present invention, wherein a driving program was performed in the following sequence for the gate voltage.

i) write: +80V 5 seconds
ii) standby: +0V 2 seconds
iii) repeat 5 times (read: −20 V 1 second→standby: +0 V 10 seconds)
iv) erase: −80 V 5 seconds
v) standby: +0 V 2 seconds
vi) repeat 5 times (read: −20 V 2 seconds→standby: +0 V 10 seconds)

Figure 15B:
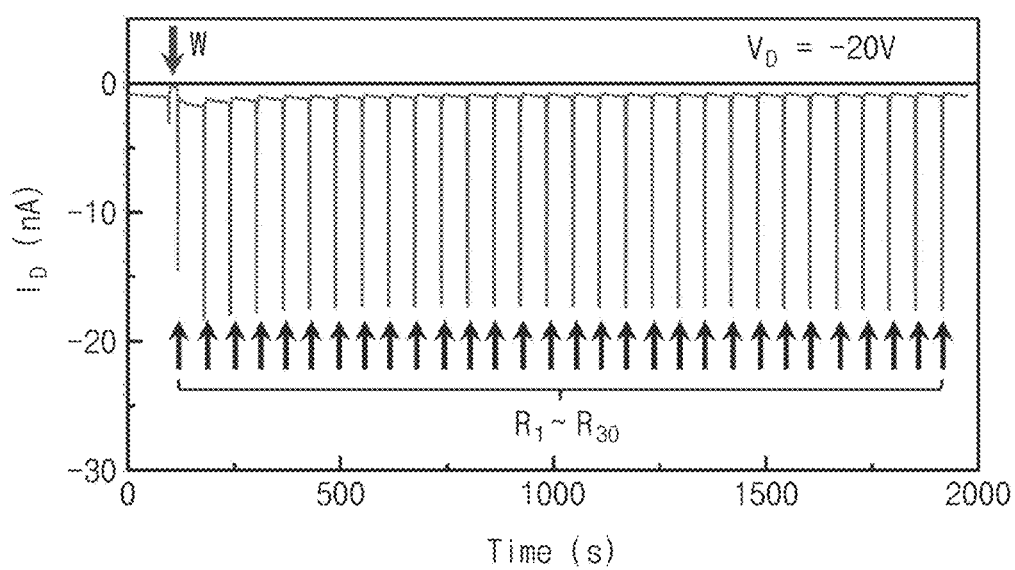
FIG. 15b illustrates the result of a stability (retention) characteristics test of the OFET device according to the embodiment of the present invention.

FIG. 15b illustrates the result of a stability (retention) characteristics test of the OFET device according to the embodiment of the present invention, wherein a driving program was performed in the following sequence for the gate voltage so as to have a read gap after write to be 60 seconds.

i) write: +80V 20 seconds
ii) repeat 35 times (read: −20 V 2 seconds→standby: +0 V 60 seconds)

Figure 15C:
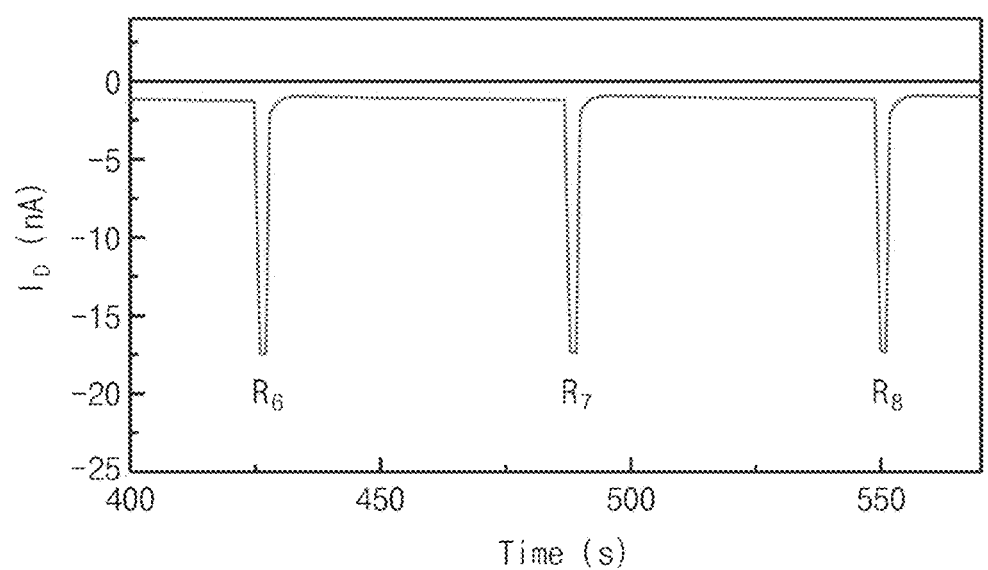
FIG. 15c is a magnified view illustrating $6^{th}$ to $8^{th}$ read operations in FIG. 15b.

FIG. 15c is a magnified view illustrating $6^{th}$ to $8^{th}$ read operations in FIG. 15b.

As illustrated in FIG. 15a, drain currents (ID) were regularly read 5 times at $V_G$=−20 V (portion 'R') after a write operation (portion W). Herein, the read operation was performed once every 10 seconds (while maintaining $V_G$=0 V). These results demonstrated that the device of the present invention operated as a basic non-volatile memory device. After erasing at $V_G$=−80V, a base line of the drain current was obviously decreased close to 0 (zero) when $V_G$=−20 V. In particular, during the write operation at $V_G$=−20 V after the erasing, since the drain current was significantly lower than the base line (ID=about −5 nA) of the drain current before the erasing, this clearly indicated a write-read-erase loop function of the device according to the embodiment of the present invention.

As illustrated in FIG. 15b, the drain current was almost periodically read by being repeated 30 times, and in this case, the drain voltage was set to be twice greater than the drain voltage of FIG. 15 ($V_D$≈−20 V) in order to make a difficult condition to read.

An extended area of the 6th to 8th read operations was disclosed in FIG. 15c, and very high data stability (retention) characteristics were exhibited.

Figure 16A:
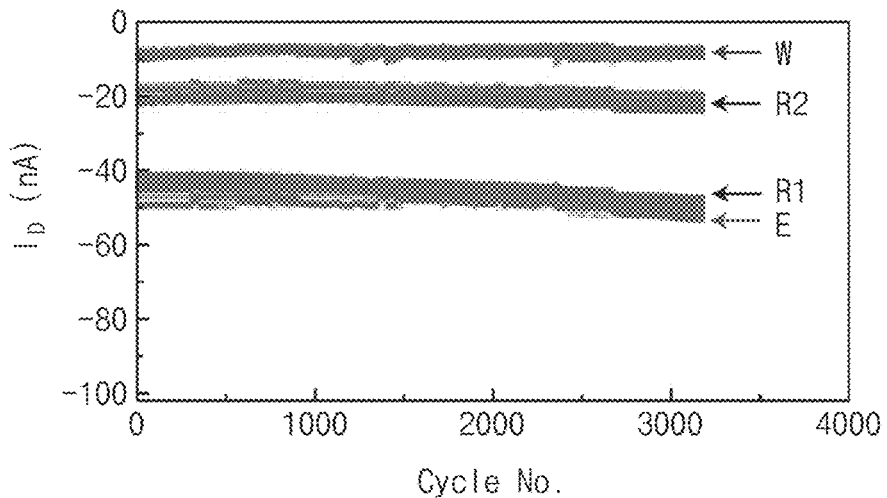
FIG. 16a illustrates the result of a test, in which 3,000 or more write-$1^{st}$ read-erase-$2^{nd}$ read operation cycles are performed for the OFET device according to the embodiment of the present invention, according to the number of cycles.
Figure 16B:
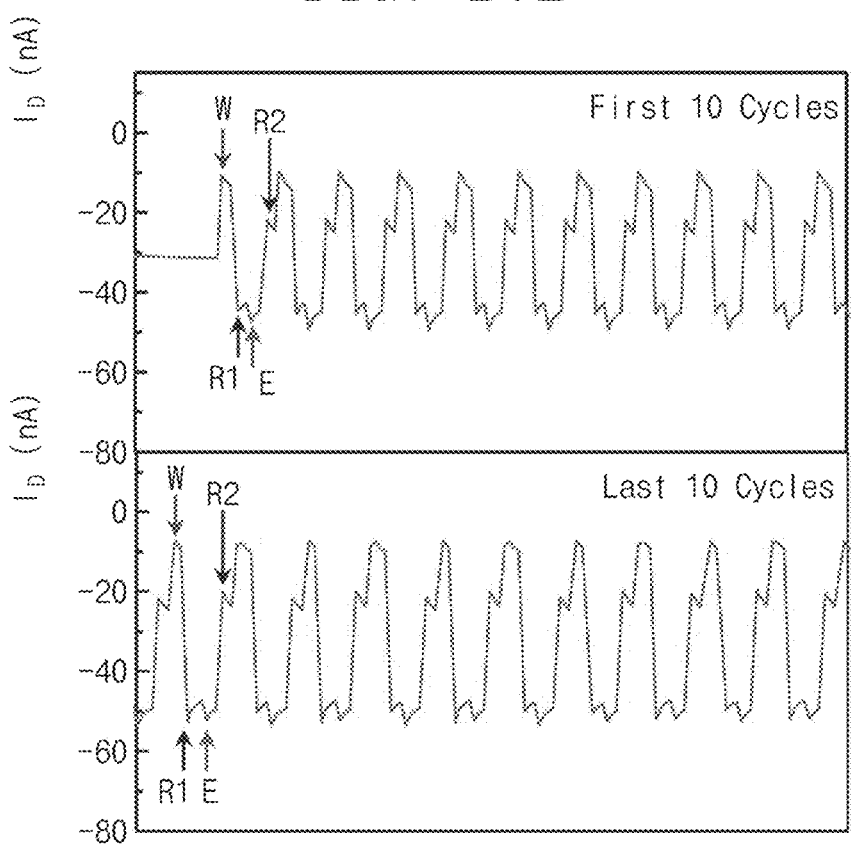

According to an embodiment of the present invention, a write-read-erase-read program was performed more than 3,000 times in order to test prolonged retention characteristics. FIG. 16a illustrates the result of a test, in which 3,000 or more write-1st read-erase-2nd read operation cycles are performed for the OFET device according to the embodiment of the present invention, according to the number of cycles, and FIG. 16b illustrates changes in drain current in the first 10 cycles (upper graph) and the last 10 cycles (lower graph) in FIG. 16a. A driving program was set to repeatedly perform the following operations i) to iv).

i) write: +80 V 2 seconds
ii) 1st read: −20 V 2 seconds
iii) erase: −80 V 2 seconds
iv) 2nd read: −20 V 2 seconds As illustrated in FIG. 16a, the drain current was relatively well maintained within a standard deviation of 6% (the 1st read after the write operation) and a standard deviation of 3.8% (the 2nd read after the erase operation). In particular, when comparing the first 10 cycles and the last 10 cycles, shapes of operation spectra ($I_D$ vs. cycle numbers) of the drain current were relatively well maintained when the spectra were inspected for each cycle even if the intensity of the drain current was changed within a given allowable range of standard deviation.

Finally, in order to confirm the charge-trapping PEW effect in the memory device structure according to the embodiment of the present invention regardless of the fact that basic necessary conditions in the energy well structure may be obtained from the energy level difference, the energy well effect was examined while changing the thickness of the SD-PARA layer.

Figure 17:
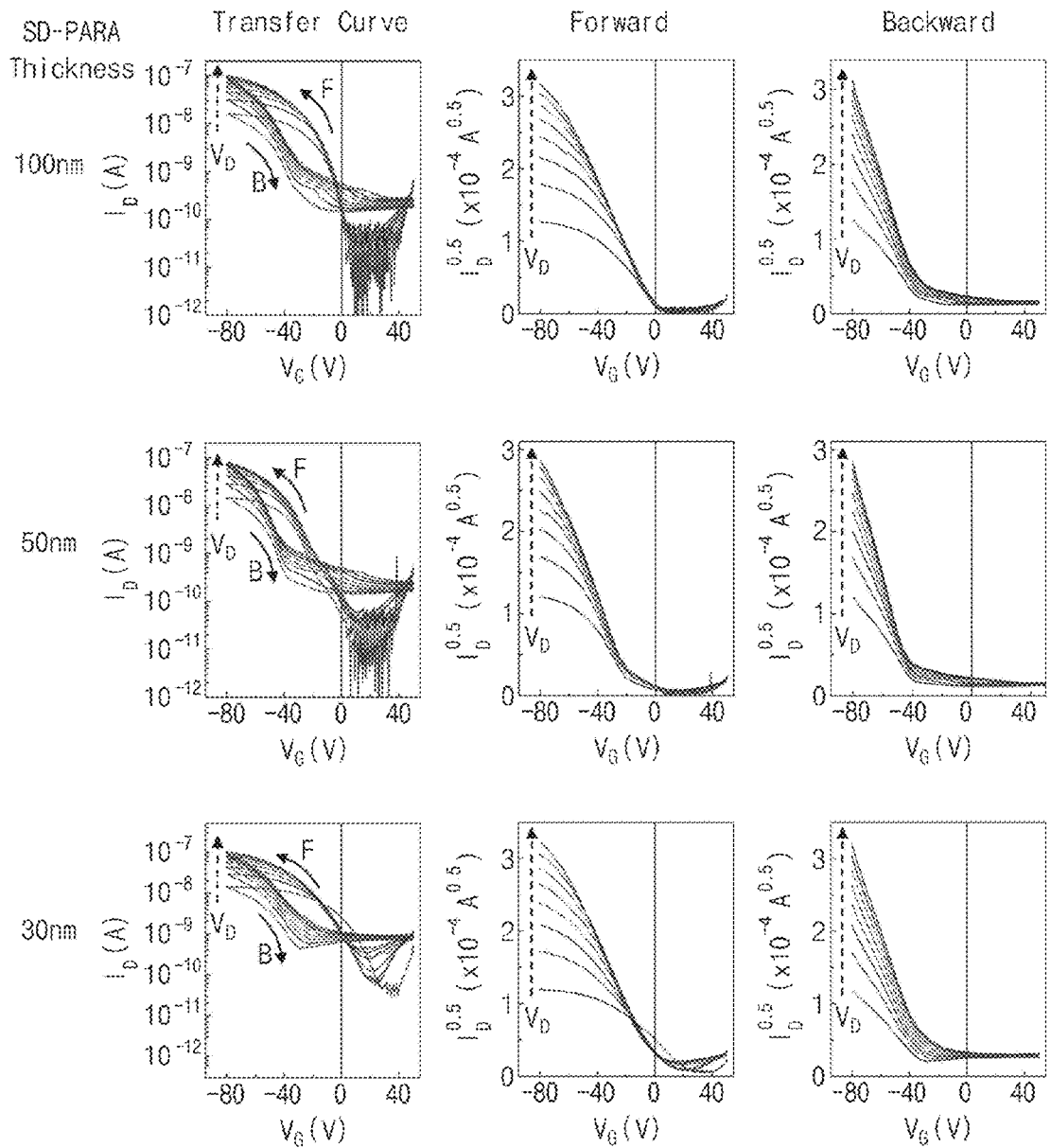
FIG. 17 illustrates transfer curves of the OFET device according to the embodiment of the present invention, according to forward and backward sweeps.

FIG. 17 illustrates transfer curves of the OFET device according to the embodiment of the present invention, according to forward and backward sweeps, wherein SD-PARA layers as an interlayer were formed to have three different thicknesses. In FIG. 17, a drain voltage was changed from −10 V to −80 V (increment of −10 V) along a direction of an arrow.

Figure 18A:
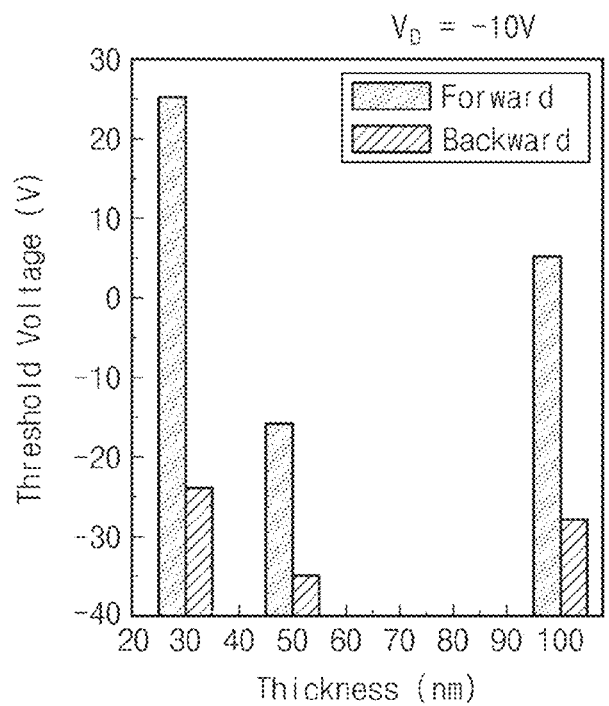
FIGS. 18a to 18c respectively illustrate threshold voltages of the OFET device according to the embodiment of the present invention as a function of the thickness of an SD-PARA layer for three drain voltages when the SD-PARA layer is used as an interlayer.
Figure 18B:
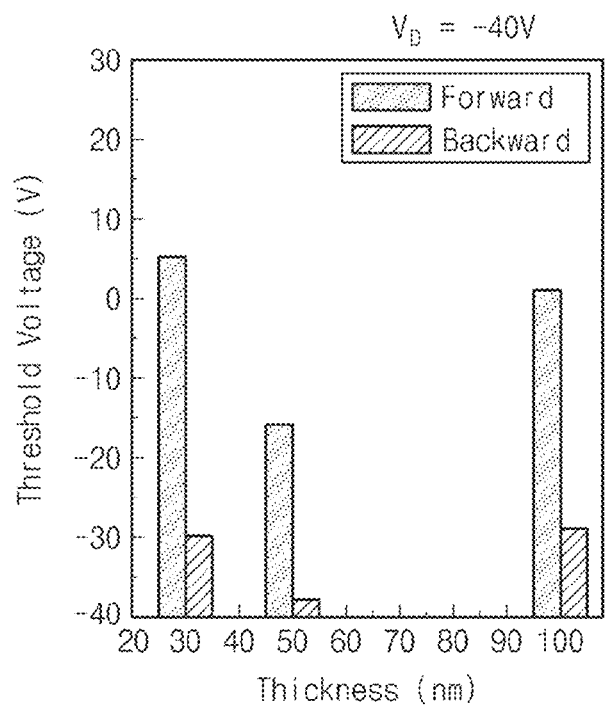
Figure 18C:
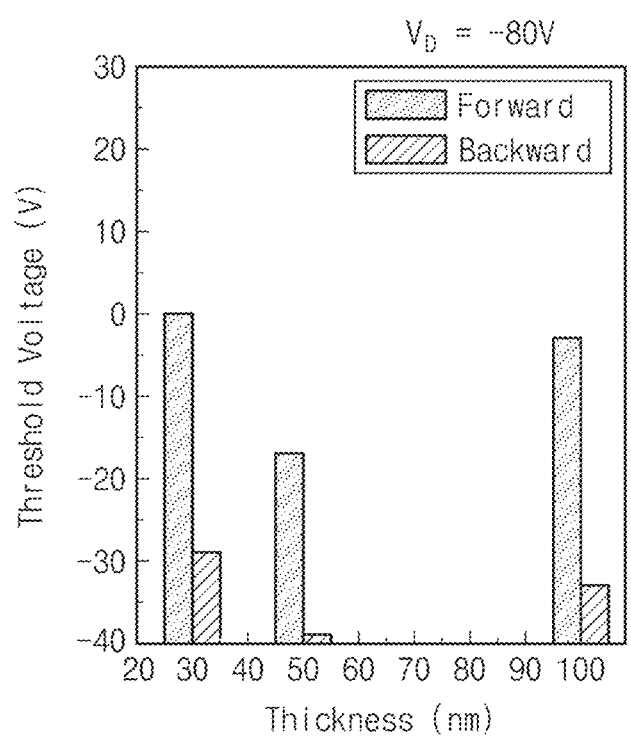

FIGS. 18a to 18c respectively illustrate threshold voltages of the OFET device according to the embodiment of the present invention as a function of the thickness of an SD-PARA layer for three drain voltages when the SD-PARA layer is used as an interlayer. In FIG. 18, the lowest threshold voltage was measured at 50 nm in all cases.

Figure 19A:
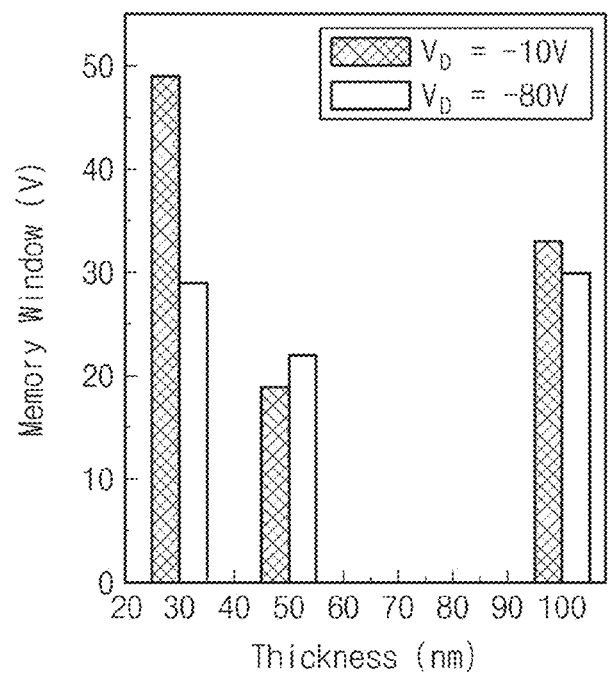
FIGS. 19a and 19b respectively illustrate a memory window and hole mobility as a function of the thickness of an SD-PARA layer when the SD-PARA layer is used as an interlayer.
Figure 19B:
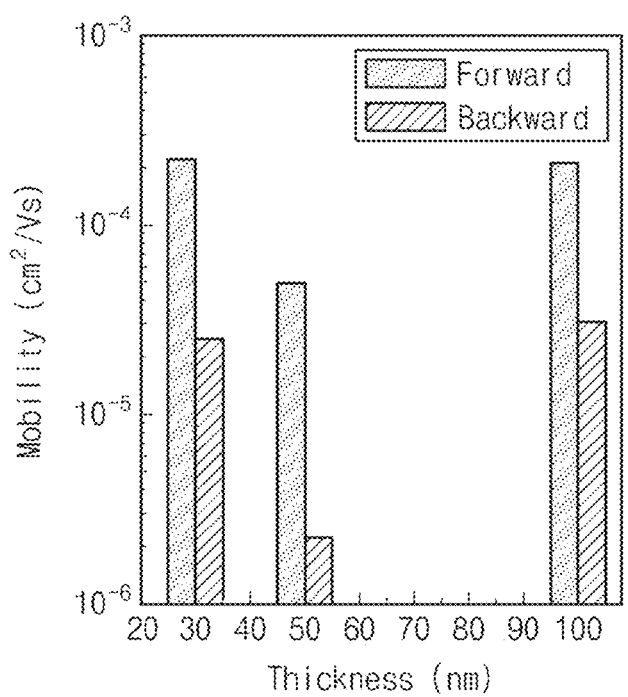

FIGS. 19a and 19b respectively illustrate a memory window and hole mobility as a function of the thickness of an SD-PARA layer when the SD-PARA layer is used as an interlayer. In FIG. 19, the lowest threshold voltage was measured at 50 nm and the memory window had a slightly low value at the thickness of 50 nm in comparison to other thicknesses regardless of the fact that the largest difference in mobility was exhibited between forward and backward sweeps.

Consequently, a confinement effect of a specific charge existed with respect to the entire thicknesses of the inspected SD-PARA, and it may be confirmed from the results that the lowest threshold voltage was measured at 50 nm among three different thicknesses. Also, the OFET device exhibited clear write-read-erase functions and excellent stability (data retention) even over prolonged operation of about 2,000 seconds or more. This may be supported by the 3,000 or more write-read-erase-read test cycles.

A non-volatile memory device according to an embodiment of the present invention may have excellent write-read-erase functions and high stability.

While preferred embodiments of the present invention has been particularly shown and described with reference to the accompanying drawings, it will be understood by those of ordinary skill in the art that various changes in form and details may be made therein without departing from the spirit and scope of the present invention as defined by the following claims.

What is claimed is:

1. A non-volatile memory device comprising:
a gate electrode;
a data storage layer provided on the gate electrode; and
a source electrode and a drain electrode provided on the data storage layer and spaced apart from each other,
wherein the data storage layer comprises three layers which form hetero-interfaces, wherein
the three layers are, sequentially, a gate dielectric layer, an interlayer, and an organic semiconductor layer, and wherein
a dielectric constant of the interlayer is greater than the a dielectric constant of the gate dielectric layer and a dielectric constant of the organic semiconductor layer.

2. The non-volatile memory device of claim 1, wherein the three layers have different dielectric constants from one another.

3. The non-volatile memory device of claim 2, wherein the three layers have different permittivities from one another.

4. The non-volatile memory device of claim 1, wherein the dielectric constant of the interlayer is in a range of about 12 to about 16, and the dielectric constants of the gate dielectric layer and the organic semiconductor layer are each in a range of about 1 to about 5.

5. The non-volatile memory device of claim 4, wherein the interlayer comprises a self-doped polymer or a polyacetylene derivative.

6. The non-volatile memory device of claim 5, wherein the interlayer comprises a self-doped aniline derivative.

7. The non-volatile memory device of claim 6, wherein the interlayer is self-doped poly(o-anthranilic acid).

8. The non-volatile memory device of claim 4, wherein the gate dielectric layer comprises an organic polymer.

9. The non-volatile memory device of claim 8, wherein the gate dielectric layer comprises at least one of poly(vinyl phenol)-methylated poly(melamine-co-formaldehyde), polystyrene, poly(α-methylstyrene), poly(2-vinyl naphthalene), poly(4-vinyl phenol), poly(2-vinyl pyridine), poly(m-ethyl methacrylate), or polyimide.

10. The non-volatile memory device of claim 4, wherein the organic semiconductor layer comprises an organic polymer.

11. The non-volatile memory device of claim 10, wherein the organic semiconductor layer comprises at least one of poly(3-hexylthiophene), poly(benzhothiadiazole), poly(cyclopentadithiophene), poly(p-phenylene vinylene), polytriarylamines, poly(indacenodithiophene), poly(perylene diimide-thieno-dithiophene), poly(naphthalene dicarboximide), poly(3,3-didodecylquaterthiophene), or poly(2,5-bis(3-alkylthiophene-2-yl)thieno[3,2-b]thiophenes).

12. A non-volatile memory device comprising:
a gate electrode;
a gate dielectric layer which is provided on the gate electrode and has a first dielectric constant;
an organic semiconductor layer which is provided on the gate dielectric layer and has a second dielectric constant;

an interlayer which is provided between the gate dielectric layer and the organic semiconductor layer and has a third dielectric constant; and a source electrode and a drain electrode which are provided on the organic semiconductor layer, wherein the third dielectric constant is greater than the first dielectric constant and the second dielectric constant.

13. The non-volatile memory device of claim 12, wherein the first dielectric constant and the second dielectric constant are each in a range of about 1 to about 5, and the third dielectric constant is in a range of about 12 to about 16.

* * * * *